United States Patent
Allemand et al.

(10) Patent No.: US 10,299,624 B2
(45) Date of Patent: May 28, 2019

(54) COOKING DEVICE PRESENTING A COOKING SURFACE INCLUDING A NON-OXIDE OR AT LEAST PARTIALLY NON-OXIDE CERAMIC NON-STICK COATING, AND CULINARY ARTICLE OR ELECTRIC HOUSEHOLD COOKING APPLIANCE INCLUDING SUCH A COOKING DEVICE

(71) Applicant: SEB S.A., Ecully (FR)

(72) Inventors: Simon Allemand, Rumilly (FR); Stéphane Tuffe, Cognin (FR)

(73) Assignee: SEB S.A., Ecully (FR)

( * ) Notice: Subject to any disclaimer, the term of this patent is extended or adjusted under 35 U.S.C. 154(b) by 516 days.

(21) Appl. No.: 14/440,678

(22) PCT Filed: Nov. 6, 2013

(86) PCT No.: PCT/FR2013/052644
§ 371 (c)(1),
(2) Date: May 5, 2015

(87) PCT Pub. No.: WO2014/072635
PCT Pub. Date: May 15, 2014

(65) Prior Publication Data
US 2015/0297026 A1  Oct. 22, 2015

(30) Foreign Application Priority Data

Nov. 6, 2012 (FR) ...................... 12 60514

(51) Int. Cl.
| | | |
|---|---|---|
| *A47J 36/04* | (2006.01) | |
| *B05D 1/18* | (2006.01) | |
| *C23C 14/12* | (2006.01) | |
| *A47J 37/06* | (2006.01) | |
| *A47J 36/02* | (2006.01) | |
| *B05D 1/00* | (2006.01) | |
| *C23C 14/34* | (2006.01) | |

(52) U.S. Cl.
CPC ............ *A47J 36/04* (2013.01); *A47J 36/025* (2013.01); *A47J 37/0611* (2013.01); *B05D 1/005* (2013.01); *B05D 1/18* (2013.01); *C23C 14/12* (2013.01); *C23C 14/34* (2013.01)

(58) Field of Classification Search
CPC ...... A47J 36/025; A47J 36/04; A47J 37/0611; C23C 14/34; C23C 14/12; B05D 1/18; B05D 1/005
USPC ........................... 99/372; 204/192.1; 427/379
See application file for complete search history.

(56) References Cited

U.S. PATENT DOCUMENTS

| | | | | |
|---|---|---|---|---|
| 4,130,675 A | * | 12/1978 | Vassiliou | C09D 181/02 427/333 |
| 5,562,991 A | * | 10/1996 | Tannenbaum | C09D 127/12 428/421 |
| 6,360,423 B1 | * | 3/2002 | Groll | A47J 36/02 220/573.1 |
| 2005/0036931 A1 | * | 2/2005 | Garcia | C01B 21/0828 423/345 |
| 2009/0191405 A1 | * | 7/2009 | Kim | C23C 18/1204 428/336 |
| 2009/0206093 A1 | * | 8/2009 | Knight | A47J 36/02 220/573.2 |
| 2010/0255340 A1 | * | 10/2010 | Ge | A47J 36/02 428/655 |
| 2011/0198357 A1 | * | 8/2011 | Muller | C23C 24/082 220/573.1 |
| 2011/0293950 A1 | | 12/2011 | Kim | |
| 2012/0034448 A1 | * | 2/2012 | Liu | B05D 5/083 428/325 |

FOREIGN PATENT DOCUMENTS

| | | | | |
|---|---|---|---|---|
| CN | 1177578 A | * | 4/1998 | ............. C04B 2/005 |
| EP | 0966910 A1 | | 12/1999 | |
| WO | WO 03033435 A2 | * | 4/2003 | ....... C04B 35/62222 |

OTHER PUBLICATIONS

Paolo Colombo; Polymer-Derived Ceramics: 40 years of Research and Innovation in Advanced Ceramics, Journal of the America Ceramic Society; vol. 93, No. 7, Jun. 1, 2010, pp. 1805-1837, ISSN: 0002-7820.*
Colombo, Paolo, et al., "Polymer-Derived Ceramics: 40 Years of Research and Innovation in Advanced Ceramics", Journal of the American Ceramic Society, vol. 93, No. 7, Jun. 1, 2010, pp. 1805-1837.

* cited by examiner

*Primary Examiner* — Dana Ross
*Assistant Examiner* — Kuangyue Chen
(74) *Attorney, Agent, or Firm* — The Webb Law Firm

(57) ABSTRACT

Provided is a cooking device, in particular a kitchen item or an electrical cooking appliance, said cooking device comprising an inner and/or upper face that can receive food and an outer and/or lower face that is coated with a non-stick coating forming a cooking surface. The non-stick coating comprises at least one continuous thin film of non-oxide or at least partially non-oxide polymer-derived ceramic, said thin film forming the cooking surface. A method for producing such a cooking device is also provided.

11 Claims, No Drawings

COOKING DEVICE PRESENTING A COOKING SURFACE INCLUDING A NON-OXIDE OR AT LEAST PARTIALLY NON-OXIDE CERAMIC NON-STICK COATING, AND CULINARY ARTICLE OR ELECTRIC HOUSEHOLD COOKING APPLIANCE INCLUDING SUCH A COOKING DEVICE

CROSS-REFERENCE TO RELATED APPLICATIONS

This application is the United States national phase of International Application No. PCT/FR2013/052644 filed Nov. 6, 2013, and claims priority to French Patent Application No. 1260514 filed Nov. 6, 2012, the disclosures of which are hereby incorporated in their entirety by reference.

FIELD OF THE INVENTION

The present invention relates generally to a cooking device belonging to a culinary article or to an electric household cooking appliance, presenting at least one face coated with a non-stick ceramic coating forming a cooking surface. The present invention also relates to a method for manufacturing such a cooking device.

The aimed field is primarily that of the culinary articles, but the present invention can also relate to any other type of items intended for the cooking of food such as the electric household appliances intended for the cooking of food.

DESCRIPTION OF RELATED ART

Those skilled in the art know the use of oxide ceramic coatings obtained through sol-gel route. It consists essentially of coatings obtained through sol-gel route from alkoxysilane-type precursors.

Currently, it is not possible to make, through sol-gel route, non-oxide or at least partially non-oxide ceramics (that is to say ceramics, a part of which, at least 25% of the material, is not oxide).

To make such ceramics (that is to say, non-oxide or at least partially non-oxide ceramics), those skilled in the art know different techniques such as the physical depositions in vapor phase (generally designated by the acronym PVD for "physical vapor deposition"), for example the magnetron cathode sputtering. In Particular, it is possible to deposit by this technique (magnetron cathode sputtering) nitrides or borides of transition metals on stainless steel substrates. The coatings obtained present both properties of hardness and of resistance to significant oxidation as well as a non-stick behavior of food during the cooking and a very easy cleaning in comparison with an uncoated stainless steel cooking surface.

However, the implementation of the vacuum deposition (in particular by magnetron cathode sputtering) presents the disadvantage of generating high manufacturing costs.

So as to avoid the constraints of vacuum depositions and the high costs that they generate and obtain equivalent levels of performances, the applicant has developed a method for making a non-oxide or at least partially non-oxide ceramic coating on a cooking support through preceramic polymer route (generally designated by the acronym PDCs for "Polymer Derived Ceramics"), in order to obtain a cooking device.

The preceramic polymer route is similar to the sol-gel method for the synthesis of non-oxide or at least partially non-oxide material.

By at least partially non-oxide ceramic material, it is meant, in the meaning of the present invention, a ceramic material including a non-oxide portion representing at least 25 atomic % of the coating.

As example of completely oxide material, the silica $SiO_2$ can for example be cited.

As example of at least partially non-oxide material and in accordance with the present invention, the silicon oxycarbide SiCO can for example be cited.

An object of the present invention is therefore a cooking device presenting a support comprising an inner and/or upper face capable of receiving food and an outer and/or lower face, said inner and/or upper face being coated with a non-stick coating forming a cooking surface.

SUMMARY OF THE INVENTION

According to the invention, the non-stick coating comprises at least one continuous thin film of non-oxide or at least partially non-oxide polymer-derived ceramic, the thin film forming the cooking surface.

Within the meaning of the present invention, the thin film is made of polymer-derived ceramic, whether it is about a non-oxide ceramic or at least partially non-oxide ceramic.

Advantageously, the non-stick coating of the cooking device according to the invention can comprise at least one continuous thin film of non-oxide or at least partially non-oxide polymer-derived ceramic, said thin film forming the cooking surface.

The cooking device according to the invention fitted with such a coating presents the following combined advantages:
non-sticking of food during cooking,
excellent ease of cleaning and durability of this ease of cleaning,
resistance to scratch,
resistance to staining,
color and appearance stability.

DETAILED DESCRIPTION OF THE INVENTION

Advantageously, the non-oxide or least partially non-oxide ceramic of the non-stick coating according to the invention is obtained from at least one preceramic polymer responding to the general formula (1):

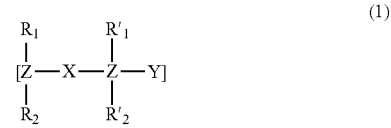

(1)

with:
X designating an element selected among O, B, N or C,
Y designating an element selected among B, N, C, C=C, and =C=N,
Z designating a metallic element selected among the transition metals, the silicon and the aluminum,
$R_1$, $R'_2$, $R_2$, $R'_2$ designate H or a hydrocarbon chain of alkyl, phenyl, acyl or aralkyl type.

Such a preceramic polymer undergoes, after its shaping on the substrate (in this case by deposition following different techniques such as the centrifugation or "spin-coating", the sputtering or the dipping), a heat treatment step to ceramize the prepolymer, that is to say to transform the preceramic prepolymer into a ceramic coating.

The ceramization of the prepolymer of formula (1) allows to elaborate non-oxide or at least partially non-oxide coatings of very high purity and presenting a homogenous distribution of the elements even at the atomic scale. From such a prepolymer, it is possible to obtain coatings with a wide variety of chemical composition: it is thus possible to make nitride, boride or carbide coatings of transition metals, silicon, aluminum. Combinations of these different systems are also achievable (eg: SiBN, SiBCN, SiCO, SiBO, SiBOC, . . . ).

Advantageously, the continuous thin film of non-oxide or at least partially non-oxide ceramic presents a thickness comprised between 0.5 and 50 µm, and preferably between 5 and 20 µm.

The ceramic prepolymer route used in the context of the the present invention allows to deposit significant coating thicknesses and with cycle times much shorter than by the PVD route, by which one can deposit with reasonable and industrially realistic cycle times, coating thicknesses of at most 5 µm.

As a usable support to make the cooking device according to the invention, it can be in particular about a support presenting the final shape of a cooking receptacle of a culinary article, with an inner and/or upper face capable of receiving food and an outer and/or lower face intended to be disposed on the side of a heat source. It can also be about a support presenting the final shape of a cooking device of an electric household cooking appliance including heating means, with an inner and/or upper face capable of receiving food and an outer and/or lower face carried by the appliance, the cooking device can be removable or not from the appliance.

The support usable in the context of the present invention can advantageously be made in a material selected among the metals, the glass, the ceramics and the vitroceramics.

By way of usable metallic supports in the method according to the invention, one can advantageously cite the supports in aluminum or in aluminum alloy, anodized or not, or in polished aluminum, brushed or micro-beaded, or in polished stainless steel, brushed or micro-beaded, or in cast steel or aluminum, or in hammered or polished copper. One can also cite the multilayer composite supports, for example the aluminum (or aluminum alloy)/stainless steel bi-layer supports and the stainless steel/aluminum (or aluminum alloy)/stainless steel three-layer supports.

Advantageously, the non-stick coating of the cooking device according to the invention can further include at least one under-layer of non-oxide or at least partially non-oxide ceramic under the thin film of ceramic.

Advantageously, at least one of the under-layer and of said thin film can comprise at least one filler and/or at least one pigment.

By way of usable fillers in the context of the present invention (either in the under-layer, or in the fim), the particles of $Al_2O_3$, of SiC, of $Si_3N_4$, of $B_4C$, of TiC, of $TiB_2$, of $CrB_2$, of $ZrB_2$ and their mixtures can especially be cited.

Advantageously, the filler is present in a proportion of at most 50% by mass relative to the total mass of the under-layer or of the thin film.

The presence of fillers in the under-layer and/or in the thin film brings multiple advantages: it allows to increase resistance to scratch, to improve the ease of cleaning and non-sticking properties, to better control of the porosity of the coating, and also to limit the cracking of the coating during its elaboration.

The possibility of incorporating pigments in the under-layer and/or in the thin film allows in turn to change the coloration.

An object of the present invention is also a culinary article including a cooking device according the invention, the support of which comprises an inner and/or upper face capable of receiving food and an outer and/or lower face intended to be disposed on the side of a heat source, said inner and/or upper face being coated with a non-stick coating forming a cooking surface. Such a culinary article can be in particular a frying pan, a saucepan, a stewpot, a wok . . . , the support forming thus a vessel. If desired, one or more handle(s) can be attached to the cooking device to form the culinary article.

Finally, still another object of the present invention is an electric household cooking appliance including a cooking device according to the invention, the support of which comprises an inner and/or upper face capable of receiving food and an outer and/or lower face carried by said appliance, the inner and/or upper face being coated with a non-stick coating forming a cooking surface. The cooking device can be removable or not from the appliance. If desired, heating means can be secured to the support. Thus, the outer and/or lower face is not necessarily intended to be disposed on the side of a heat source. Such an electric household appliance can in particular be an electric cooker including a vessel, a scraper appliance including cups, a bread machine, an appliance including a cooking plate, such as a plancha, a waffle iron . . .

An object of the present invention is also a method for manufacturing a cooking device, characterized in that it comprises the following steps:

a) a step of providing and/or making a support presenting at least two opposite faces;

b) a step of preparing a preceramic polymer from a molecular precursor of said polymer comprising the suspension of said molecular precursor in a fluid, this fluid can be an organic solvent or water, then its polymerization to obtain a preceramic polymer composition;

c) a step of applying on at least one of the faces of the support at least one layer of said preceramic polymer composition;

d) optionally a drying step, and e) a heat treatment step to ceramize said preceramic polymer and thus form a thin film of non-oxide polymer-derived ceramic.

In the context of the method according to the invention, the thin film is manufactured on at least one of the faces of the support by preceramic polymer route. This process is similar to the sol-gel method for the synthesis of non-oxide (or at least partially non-oxide) material, and constitutes an alternative route to vacuum deposition such as the one made by magnetron cathode sputtering to elaborate coatings of boride, diboride or nitride type of transition metals.

Unlike the magnetron cathode sputtering route, the preceramic polymer route, which does not require to make the secondary vacuum deposition and thus under much more severe elaboration conditions, allows therefore a non prohibitive manufacturing cost of the coating, which is necessary for the economic viability of the project.

The support is as previously defined. It can in particular be about a support presenting the final shape of a cooking device of a culinary article, with an inner and/or upper face capable of receiving food and an outer and/or lower face intended to be disposed on the side of a heat source, or of a support presenting the final shape of a cooking device of an electric household cooking appliance including heating means, with an inner and/or upper face capable of receiving food and an outer and/or lower face carried by the appliance, the cooking device can be removable or not from the appliance. The cooking device forms for example a plate, a cup or a vessel.

The preceramic polymer is also as previously defined and responds to the general formula (1) defined above. It is obtained during the step b) of the method of the invention from a molecular precursor of the polymer, which is selected depending on the chemical composition of the desired final ceramic.

Thus, we desire to make a thin film of niobium nitride, we can use, by way of molecular precursors, precursors of the $Nb(NR_2)_5$ or $(NR_2)_3Nb=NR$ type. These precursors can be synthesized from $NbCl_5+LiNMe_2$ (the term Me designating a methyl grouping). The direct reaction of $NbCl_5$ with an amine ($NH_3$ or $NH_2R$) can also be considered.

If we desire to make a thin film of chromium boride, we can use by way of molecular precursors, precursors of the $Cr(BH_4)_5$ type. They can be synthesized from $CrCl_3+$either $NaBH_4$, or $KBF_4$, or $NH_3BH_3$, all commercial precursors. These chromium boride precursors are transportable to the system $TiB_2$ or more generally $XB_2$, X being a transition metal.

If we desire to make a thin film made of a silicon compound, numerous precursors can be used depending on the nature of the targeted coating (silicon nitride, silicon carbide, silicon boronitride, silicon carbonitride, . . . ). Numerous combinations are possible:
  to manufacture a SiC film, we can use by way of molecular precursor a polycarbosilane,
  to manufacture a SiCO film, we can in particular use by way of molecular precursor a polycarbosiloxane,
  to manufacture a SiBO film, we can in particular use by way of molecular precursor a polyborosiloxane.

The molecular precursors are suspended from said molecular precursor in a fluid, for example an organic solvent or water, in order to form a stable suspension. Additives are added in order to obtain a viscosity adapted to the used shaping method.

This suspension is then applied on one of the faces of the support (step c) of the method according to the invention, to form a preceramic polymer layer covering the inner face of the support. This application can be made by sputtering ("spray-coating"), dipping ("dip-coating") or spin deposition ("spin-coating").

The advantage of the preceramic polymer route lies especially in the fact that the starting product is a suspension of molecular precursor (s), the chemical and rheological properties of which are such that they are compatible with a wide number of industrial shaping methods, such as those mentioned above.

After the shaping, the preceramic polymer layer covering the inner face of the support is subjected to an appropriate heat treatment e) (possibly preceded by a drying step), which completes the ceramization process of the coating and allows obtaining a thin film of non-oxide polymer-derived ceramic.

The interest of a ceramization made from a preceramic polymer lies thus in their relatively lower synthesis temperature relative to a conventional method of sintering ceramic powder.

The step e) of heat treatment can be made in different ways, and especially by pyrolysis in a resistive furnace at a temperature below 1000° C. or in a rapid annealing furnace (or an RTA furnace for "Rapid Thermal Annealing").

However, the reached temperatures remain high during the pyrolysis allowing to convert the preceramic polymer into ceramic (between 800° C. and 1200° C.), and the risks of damage and of deformation of the metallic substrate (in particular in the case of a culinary article such as a frying pan) are therefore significant.

Consequently, the heat treatment step will be preferably made in a rapid annealing furnace (or RTA furnace), at a maximum temperature of 1350° C. during a less than 4 hours time period. In this case, only the preceramic polymer layer receives the heat by absorption of the irradiation, and the metallic substrate is therefore only heated by conduction, thus greatly limiting the reached temperature by the substrate.

The heat treatment can be made under an inert or reagent gas depending on the nature of the targeted ceramic.

During the heat treatment, a volume shrinkage originating from the starting of products due to the advancing of the crosslinking of the preceramic species can appear. The incorporation of fillers dispersed in the ceramic matrix allows to solve this problem, these fillers can in addition play the role of the coating reinforcement, thus improving the scratch resistance of the surface.

The method according to the invention leads to a ceramic film of a density lower than that obtained by PVD deposition for example. Consequently, such a method allows to incorporate edible oils at the porosities of the formed ceramic coating (film with or without under-layer) and thus to improve the non-sticking and ease of cleaning properties.

Unless otherwise specified, all the percentages of components of the present application are expressed in mass percentages. The invention is illustrated in more detail in the following examples.

EXAMPLES

Products
Molecular Precursors
  the allyhydridopolycarbosilane, commercialized under the trade name AHPCS by the Starfire Systems company (for obtaining a thin film of SiC),
  the commercial product Polyramic® SPR-036 of the Starfire Systems company (for obtaining a thin film of $Si_xC_yO_z$).

Support: substrate made of of stainless steel, smooth or sanded.

In accordance with the method of the invention, the deposition of a thin film of SiC on the stainless steel substrate is made by proceeding as follows:

1. The molecular precursor is put into solution in THF (tetrahydrofuran). Other solvents, such as the toluene can also be used. A 20% concentration of precursor in the solvent allows to obtain a coating without cracks. Above this value, very significant porosities and cracks of the coating are observed on the final coating, after ceramization. Below this value, the topology of the coating is too close to that of the substrate and it is therefore difficult to obtain the targeted thicknesses.

2. The shaping is made by dipping ("dip coating"), the dipping time being fixed at 2 minutes. For more significant dipping times, a more significant film thickness would be obtained, that would likely result in the formation of porosities and of cracks of the coating during the rise in temperature. Several dipping steps are necessary for obtaining a coating with a sufficient thickness (in the order of 10 μm) and limiting the cracking.

3. The heat treatment allowing to convert the preceramic polymer into a ceramic is made in a furnace in two steps, in air or in argon according to the cases:

for obtaining a film of SiC, the method is the following:
Dip coating→Pyrolysis in air at 1000° for 2 hours→Dip coating→Pyrolysis in Argon at 800° C. for 2 hours.

The 1$^{st}$ pyrolysis in air allows to obtain an "oxidized" under-layer and a better sticking of the final coating.

for obtaining a film of $Si_xC_yO_z$, the method is as follows:
Dip coating→Pyrolysis in air at 1000° C. for 2 hours-→Dip coating→Pyrolysis in Argon at 800° C. for 2 hours.

Other shaping methods ("spray coating" or "spin coating") or of heat treatment (RTA furnace) can also be considered to obtain these coatings.

The invention claimed is:

1. A method for manufacturing a cooking device having a support comprising an inner face capable of receiving food and an outer face, said inner face being coated with a non-stick coating forming a cooking surface, wherein said non-stick coating consists of at least one continuous thin film of non-oxide polymer-derived ceramic or polymer-derived ceramic comprising a non-oxide portion representing at least 25 atomic % of the ceramic, said at least one continuous thin film forming the cooking surface, wherein said at least one continuous thin film has a thickness comprising between 5 μm and 20 μm, the method comprising the following steps:
a) providing a support presenting at least two opposite faces;
b) preparing a preceramic polymer from a molecular precursor of said preceramic polymer comprising the suspension of said molecular precursor in a fluid, said fluid being an organic solvent or water, in a concentration of less than 20% of said molecular precursor in said fluid, then polymerizing to obtain a preceramic polymer composition;
c) applying on at least one of the faces of the support of at least one layer of said preceramic polymer composition;
d) optionally a drying, and
e) heat treating to ceramize said preceramic polymer to form a thin film of non-oxide polymer-derived ceramic or polymer-derived ceramic.

2. The method according to claim 1, wherein the preceramic polymer responds to the chemical formula shown below:

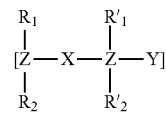

with

X designating an element selected among O, B, N or C,
Y designating an element selected among B, N, C, C=C, and =C=N,
Z designating a metallic element selected among transition metals, silicon and aluminum,
$R_1$, $R'_1$, $R_2$, $R'_2$ designating H or a hydrocarbon chain of alkyl, phenyl, acyl or aralkyl type.

3. The method according to claim 1, wherein the application of said preceramic polymer composition is made by one of sputtering, dipping or spin deposition.

4. The method according to claim 1, wherein the heat treating step is made in a rapid annealing furnace, at a maximum temperature of 1350° C. for a less than a 4-hour time period.

5. The method according to claim 1, wherein the support presents a final shape of the cooking device, including a bottom with an inner face capable of receiving food and an outer face intended to be disposed on a side of a heat source.

6. The method for manufacturing a cooking device according to claim 1,
wherein the heat treating comprises a rapid annealing furnace, at a maximum temperature of 1350° C. for a less than a 4-hour time period.

7. The method according to claim 1, wherein the support is made of a material selected among metals, glass, ceramics, and glass-ceramics.

8. The method according to claim 1, wherein said non-stick coating consists of at least one under-layer of non-oxide ceramic or ceramic comprising a non-oxide portion representing at least 25 atomic % of the ceramic, said under-layer being disposed under said at least one continuous thin film.

9. The method according to claim 1, wherein said non-stick coating consists of at least one under-layer of non-oxide ceramic or ceramic comprising a non-oxide portion representing at least 25 atomic % of the ceramic, said under-layer being disposed under said at least one continuous thin film, and wherein said under-layer or said at least one continuous thin film comprises at least one filler or at least one pigment.

10. The method according to claim 9, wherein the filler is selected from aluminum oxide, silicon carbide, silicon nitride, boron carbide, titanium carbide, titanium boride, chromium boride, zinc boride, or mixtures thereof.

11. The method according to claim 9, wherein the filler is present in a proportion of at most 50% by mass relative to the total mass of the under-layer or of said at least one continuous thin film.

* * * * *

UNITED STATES PATENT AND TRADEMARK OFFICE
CERTIFICATE OF CORRECTION

PATENT NO. : 10,299,624 B2
APPLICATION NO. : 14/440678
DATED : May 28, 2019
INVENTOR(S) : Simon Allemand et al.

It is certified that error appears in the above-identified patent and that said Letters Patent is hereby corrected as shown below:

In the Claims

Column 8, Line 8, Claim 2, delete "0," and insert -- O, --

Signed and Sealed this
Thirteenth Day of August, 2019

Andrei Iancu
*Director of the United States Patent and Trademark Office*